United States Patent
Yoneda

(10) Patent No.: US 7,834,402 B2
(45) Date of Patent: Nov. 16, 2010

(54) SEMICONDUCTOR INTEGRATED CIRCUIT DEVICE

(75) Inventor: Hideyuki Yoneda, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 855 days.

(21) Appl. No.: 11/798,376

(22) Filed: May 14, 2007

(65) Prior Publication Data

US 2007/0285118 A1    Dec. 13, 2007

(30) Foreign Application Priority Data

May 23, 2006    (JP)    ............... 2006-142889

(51) Int. Cl.
*H01L 23/62*    (2006.01)
(52) U.S. Cl. ...................... 257/369; 257/278
(58) Field of Classification Search ................ 257/369, 257/67, 74, 278; 326/12, 13
See application file for complete search history.

(56) References Cited

U.S. PATENT DOCUMENTS

2005/0264334 A1    12/2005    Yoneda

FOREIGN PATENT DOCUMENTS

JP    2005-341354    12/2005

OTHER PUBLICATIONS

Andrews et al., "Single Event Error Immune CMOS RAM", IEEE Trans. on Nucl. Sci., vol. NS-29, No. 6, pp. 2040-2043 (Dec. 1982).
Nikkei Electronics, pp. 82-99 (Oct. 2005).

*Primary Examiner*—Ha Tran T Nguyen
*Assistant Examiner*—Shaun Campbell
(74) *Attorney, Agent, or Firm*—Young & Thompson

(57) ABSTRACT

To strengthen tolerance to radiation. Source and back gate of P-channel transistor P1 are connected to power supply. Gate of the P-channel transistor P1 is connected to input terminal IN. Gate of N1 is connected to IN. Drain of N1 is connected to OUT. Cathode of diode D1 is connected to power supply, anode of D1 being connected to OUT. Cathode of diode D2 is connected to OUT, anode of D2 being grounded. When seen from a direction perpendicular to a substrate on which an inverter circuit is formed, a projection plane of a region of a p+ diffusion layer of D1 includes a projection plane of a region of an n+ diffusion layer of N, and a projection plane of a region of an n+ diffusion layer of the diode D2 includes a projection plane of a region of a p+ diffusion layer of P1.

10 Claims, 9 Drawing Sheets

A—A'

SEMICONDUCTOR INTEGRATED CIRCUIT DEVICE

FIELD OF THE INVENTION

The present invention relates to a semiconductor integrated circuit device. More specifically, the invention relates to a semiconductor integrated circuit device with tolerance to radiation thereof strengthened.

BACKGROUND OF THE INVENTION

Circuits that store data, such as a latch circuit or a flip-flop circuit, may cause an erroneous operation due to inversion of a stored data value. This inversion is caused by incidence of a radiation of heavy particles or the like which are present in a cosmic space. This phenomenon will be described using a latch circuit formed of two inverter circuits of a CMOS type as an example.

Assume that in the latch circuit shown in FIG. 9, an inverter circuit 101 first outputs a low level, and an inverter circuit 102 outputs a high level. At this point, a P-channel transistor 103 is in an on state, while an N-channel transistor 104 is in an off state. When a radiation (of heavy particles) enters a drain of the N-channel transistor 104, a current 105 flows from the drain to a substrate (ground). This current 105 is supplied as a current 106 through the P-channel transistor 103 in the on state. Since the P-channel transistor 103 has an on resistance, a voltage drop occurs at a drain of the P-channel transistor 103 due to flow of the current 106. That is, a voltage at a node 107 drops. The larger energy received from the heavy particles which have entered the drain of the N-channel transistor 104, the larger a magnitude of the current 105 (=a magnitude of the current 106) increases. As a result, a drop range of the voltage at the node 107 increases.

When a voltage change at the node 107 at a time of incidence of the radiation to the inverter circuit 102 exceeds a threshold voltage of an input to the inverter circuit 101 connected to the node 107, a voltage at a node 108, which is an output of the inverter circuit 101, is inverted from a low level to a high level. When the voltage at the node 108 is inverted, a value input to an input terminal of the inverter circuit 102 connected to the node 108 is also inverted from the low level to the high level. This inverts an output of the inverter circuit 102 from the high level to the low level. That is, when a magnitude of the energy received from the radiation that has entered the inverter circuit 102 exceeds a certain level, a value latched at the latch circuit will be inverted, thereby causing an erroneous operation.

In the above description, an explanation was given, assuming that the inverter circuit 101 outputs the low level, and the inverter 102 outputs the high level. However, when the inverter circuit 101 outputs the high level, the inverter circuit 102 outputs the low level, and the heavy particles enter the drain of the P-channel transistor 103 in the off state as well, the same phenomenon occurs. In this case, a current flows through an on resistance of the N-channel transistor 104 in the on state, and the voltage at the node 107 increases. Then, the value latched by the latch circuit will be inverted, thereby causing an erroneous operation.

When a semiconductor integrated circuit device is used in the cosmic space or the like, the erroneous operation as described above will become a great problem. Then, in the semiconductor integrated circuit device used in the cosmic space or the like, it is necessary to set tolerance of the semiconductor integrated circuit device to radiation to be larger than that of a common semiconductor integrated circuit so as not to cause any erroneous operation even when the radiation of the heavy particles or the like enters. As a method of improving tolerance of a latch circuit to radiation, a method of adding resistance to the latch circuit (resistance-added latch circuit of the resistive decoupling type) is described in Non-patent Document 1. In the resistance-added latch circuit, a resistance is inserted between an output of an inverter circuit and an input to an inverter circuit in a next stage. Since the resistance is inserted, a waveform of an input voltage is more rounded (a peak value of the waveform is reduced) than when the resistance is not added. Accordingly, a voltage change peak value caused by incidence of radiation is reduced by the input to the inverter circuit in the next stage. The voltage change peak value does not reach a threshold (threshold) value. For this reason, the value latched by the latch circuit will not be inverted.

In the resistance-added latch circuit as described above, the waveform is rounded by addition of the resistance in an ordinary operation of the latch circuit. It is therefore difficult to operate the circuit at high speed. Then, a technique that forms a circuit which has high tolerance to irradiation of radiation while operating at high speed is disclosed in Patent Document 1. In a latch circuit described in Patent Document 1, a hysteresis circuit is added to an input to a logic circuit, thereby increasing a threshold voltage of the latch circuit. Accordingly, even when a radiation enters, inclusion of noise induced by the radiation into an input in the next stage can be prevented by the increased threshold voltage, and inversion of a value latched by the latch circuit can be thereby prevented. Since rounding of the waveform is not generated at a time of the normal operation, the circuit can be operated at high speed.

[Non-Patent Document 1]
J. L. Andrews, "SINGLE EVENT ERROR IMMUNE CMOS RAM", IEEE Transactions on Nuclear Science, Vol. NS-29, No. 6, pp. 2040-2043, December 1982

[Patent Document 1]
JP Patent Kokai Publication No. JP-P2005-341354A (FIG. 4)

SUMMARY OF THE DISCLOSURE

In the following analyses on the related art are given according to the present invention. The entire disclosures of the aforementioned Non-patent and Patent documents are herein incorporated by reference thereto.

The threshold voltage of the latch circuit described in Patent Document 1 is increased by the hysteresis circuit. However, when an intensity of the radiation that has entered the latch circuit is strong, noise that exceeds the threshold voltage is induced, thereby causing an erroneous operation, which is the same as the latch circuit in FIG. 9. Thus, it is difficult to say that the latch circuit in Patent Document 1 has sufficient tolerance to incidence of radiation.

The inventor of the present invention considers that when a radiation enters, an erroneous operation can be prevented by setting an output voltage itself of a logic circuit not to be changed rather than making it hard to transmit a change in the output voltage of the logic circuit to a next stage. Based on this concept, the inventor has conceived the present invention.

According to a first aspect of the present invention there is provided a semiconductor integrated circuit device comprising: a logic circuit of a CMOS type formed by combining a field-effect transistor group of a first conductivity type with a field-effect transistor group of a second conductivity type, the field-effect transistor group of the first conductivity type being connected between a power supply and an output terminal, the field-effect transistor group of the second conductivity type being connected between ground and the output terminal. The logic circuit includes: a first diode connected between the power supply and the output terminal to provide an inverse bias; and a second diode connected between the ground and the output terminal to provide an inverse bias. Arrangement is made so that, when seen from a direction perpendicular to a substrate having the logic circuit formed thereon, a projection plane of a diffusion layer region of the first diode includes projection planes of respective drain diffusion layer regions of transistors included in the field-effect transistor group of the second conductivity type; and a substrate having the respective drain diffusion layer regions being present therein is disposed separated from a substrate having the diffusion layer region of the first diode being present therein. Arrangement is made so that, when seen from the direction perpendicular to the substrate having the logic circuit formed thereon, a projection plane of a diffusion layer region of the second diode includes projection planes of respective drain diffusion layer regions of transistors included in the field-effect transistor group of the first conductivity type; and a substrate having the respective drain diffusion layer regions being present therein is disposed separated from a substrate having the diffusion layer region of the second diode being present therein are separated.

The logic circuit may comprise an inverter circuit having the field-effect transistor group of the first conductivity type comprising first transistors, and having the field-effect transistor group of the second conductivity type comprising second transistors.

The semiconductor integrated circuit device may comprise two of the inverter circuits; the two of the inverter circuits forming a latch circuit by combining an input terminal of one of the inverter circuits to an output terminal of the other of the inverter circuits and combining an input terminal of the other of the inverter circuits to an output terminal of the one of the inverter circuits.

The logic circuit may comprise a two-input NOR circuit in which the field-effect transistor group of the first conductivity type comprises first and second transistors connected in cascade, and the field-effect transistor group of the second conductivity type comprises third and fourth transistors connected in parallel.

The logic circuit may comprise a two-input NAND circuit in which the field-effect transistor group of the first conductivity type comprises first and second transistors connected in parallel, and the field-effect transistor group of the second conductivity type comprising third and fourth transistors connected in cascade.

The semiconductor integrated circuit device may comprise two of the two-input NOR circuits; the two of the two-input NOR circuits forming a flip-flop circuit by combining an input terminal of one of the two-input NOR circuits to an output terminal of the other of the two-input NOR circuits and combining an input terminal of the other of the two-input NOR circuits to an output terminal of the one of the two-input NOR circuits.

The semiconductor integrated circuit device may comprise two of the two-input NAND circuits; the two of the two-input NAND circuits forming a flip-flop circuit by connecting an input terminal of one of the two-input NAND circuits to an output terminal of the other of the two-input NAND circuits and connecting an input terminal of the other of the two-input NAND circuits to an output terminal of the one of the two-input NAND circuits.

The substrate having the respective drain diffusion layer regions being present therein and the substrate having the diffusion layer region of the first diode being present therein are superposed together interposed with an insulating layer.

The insulating layer may include therein: a wiring pattern that makes electrical connection between the substrate with the respective drain diffusion layer regions being present therein and the substrate having the diffusion layer region of the first diode being present therein.

According to a second aspect of the present invention there is provided a semiconductor integrated circuit device comprising: a logic circuit of a CMOS type formed by combining a first conductivity type field-effect transistor with a second conductivity type field-effect transistor, the first conductivity type field-effect transistor being connected between a power supply and an output terminal, the second conductivity type field-effect transistor being connected between a ground and the output terminal. The logic circuit includes: a first diode connected between the power supply and the output terminal to provide an inverse bias; and a second diode connected between the ground and the output terminal to provide an inverse bias. Arrangement is made so that, when seen from a direction perpendicular to a substrate having the logic circuit formed thereon, a projection plane of a diffusion layer region of the first diode includes a projection plane of a drain diffusion layer region of the second conductivity type field effect transistor; and a substrate having the drain diffusion layer region being present therein is disposed separated from a substrate having the diffusion layer region of the first diode being present therein. Further, arrangement is made so that, when seen from the direction perpendicular to the substrate having the logic circuit formed thereon, a projection plane of a diffusion layer region of the second diode includes a projection plane of a drain diffusion layer region of the first conductivity type field-effect transistor; and a substrate having the drain diffusion layer region being present therein is disposed separated from a substrate having the diffusion layer region of the second diode being present therein.

The meritorious effects of the present invention are summarized as follows.

According to the present invention, a current generated when a radiation enters a semiconductor integrated circuit device of the invention, flows through a transistor and a diode which are connected to an output terminal. A next stage of the semiconductor integrated circuit device will not therefore by influenced by the radiation. Accordingly, a logic circuit can be formed which does not cause an erroneous operation even if the intensity of the entered radiation is strong.

PREFERRED MODES OF THE INVENTION

In a semiconductor integrated circuit device according to an example of the present invention, a first diode and a second diode are added to an output of a logic circuit of a CMOS type such as an inverter circuit, NAND circuit, or NOR circuit. The first diode is connected between a power supply and an output terminal so as to provide an inverse bias. The second diode is connected between ground and the output terminal so as to provide an inverse bias. Arrangement is made so that, when seen from a direction perpendicular to a substrate with the logic circuit formed thereon, a projection plane of a diffusion layer region of the first diode covers projection planes of respective drain diffusion layer regions of transistors included in an N-channel transistor group. In addition, the arrangement is made so that a projection plane of a diffusion layer region of the second diode includes projection planes of respective drain diffusion layer regions of transistors included in a P-channel transistor group. Further, the arrangement is made so that a substrate having the respective drain diffusion layer regions being present therein and a substrate having the diffusion layer region of the diode being present therein are separated from one another (not physically contacted). However, the substrates are electrically connected by wiring.

By structuring semiconductor integrated circuit device as described above, a logic circuit can be formed, of which an output voltage is not influenced by the incidence of the radiation even if incidence of a radiation on the logic circuit occurs. That is, when the radiation enters a drain diffusion layer region of an N-channel transistor, the radiation enters the diffusion layer region of the first diode as well. When the radiation enters a drain diffusion layer region of a P-channel transistor, the radiation enters the diffusion layer region of the second diode as well. Then, by the incidence of the radiation, a current generated in the N-channel transistor in an off state and a current generated in the first diode cancel to each other. Also, by the incidence of the radiation, a current generated in the P-channel transistor in the off state and a current generated in the second diode cancel to each other. Accordingly, even if the radiation enters the logic circuit, an output voltage of the logic circuit hardly changes (i.e., suffers a minimum amount of change, even if found). The logic circuit that includes sufficient tolerance to the incidence of the radiation can be formed.

Further, by combining the logic circuits with the strengthened tolerance to radiation, a latch circuit, a flip-flop circuit, or the like can be formed in which a stored value will not be inverted even if incidence of radiation occurs. Further detailed description will be given below in connection with examples.

FIRST EXAMPLE

Figure 1A:
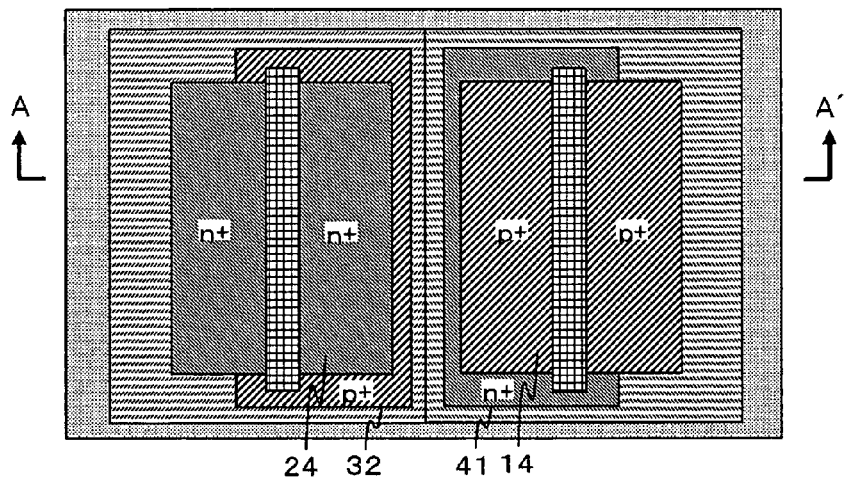
FIGS. 1A, 1B and 1C include diagrams showing a structure and a circuit of a semiconductor integrated circuit device according to a first example of the present invention.
Figure 1B:
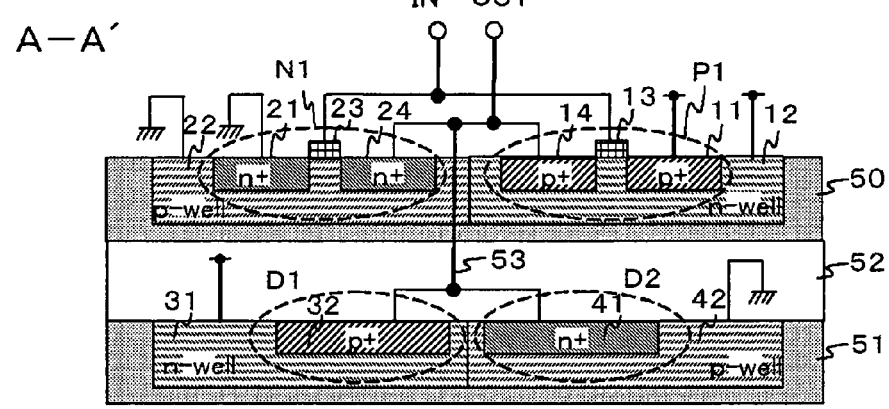
Figure 1C:
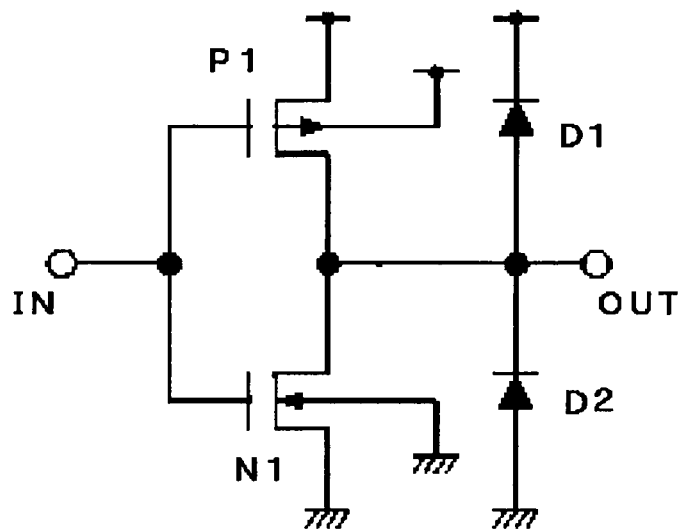

FIG. 1 includes diagrams showing a structure and a circuit of a semiconductor integrated circuit device according to a first example of the present invention. FIG. 1A is a plan view of the semiconductor integrated circuit device. FIG. 1B is a sectional view taken along a line A-A' of the semiconductor integrated circuit device shown in FIG. 1A. FIG. 1C is a circuit diagram of the semiconductor integrated circuit device. Referring to FIGS. 1A, 1B and 1C, the semiconductor integrated circuit device is an inverter circuit of the CMOS type, and includes a P-channel transistor P1, an N-channel transistor N1, and diodes D1 and D2. A source (a P+ diffusion layer 11) and a back gate (an n well 12) of the P-channel transistor P1 are connected to the power supply. A gate 13 of the P-channel transistor P1 is connected to an input terminal IN, and a drain (a p+ diffusion layer 14) of the P-channel transistor P1 is connected to an output terminal OUT. A source (an n+ diffusion layer 21) and a back gate (a p well 22) of the N-channel transistor N1 are grounded. A gate 23 of the N-channel transistor N1 is connected to the input terminal IN, and a drain (an n+ diffusion layer 24) of the N-channel transistor N1 is connected to the output terminal OUT. A cathode (an n well 31) of the diode D1 is connected to the power supply, and an anode (a p+ diffusion layer 32) of the diode D1 is connected to the output terminal OUT. A cathode (an n+ diffusion layer 41) of the diode D2 is connected to the output terminal OUT, and an anode (a p well 42) of the diode D2 is grounded.

As shown in FIGS. 1A and 1B, arrangement is made so that, as seen from a direction perpendicular to (main surface of) a substrate on which the inverter circuit is formed, a projection plane of a region of the p+ diffusion layer 32 includes (covers) a projection plane of a region of the n+ diffusion layer 24, and a substrate (or the p well 22) having the n+ diffusion layer 24 being present therein and a substrate (or the n well 31) having the p+ diffusion layer 32 being present therein are disposed separated from one another. Further, arrangement is made so that, as seen from the direction perpendicular to the substrate on which the inverter circuit is formed, a projection plane of a region of the n+ diffusion layer 41 includes a projection plane of a region of the p+ diffusion layer 14, and a substrate (or the n well 12) having the p+ diffusion layer 14 being present therein and a substrate (or the p well 42) having the n+ diffusion layer 41 being present therein are disposed separated from one another.

Figure 2A:
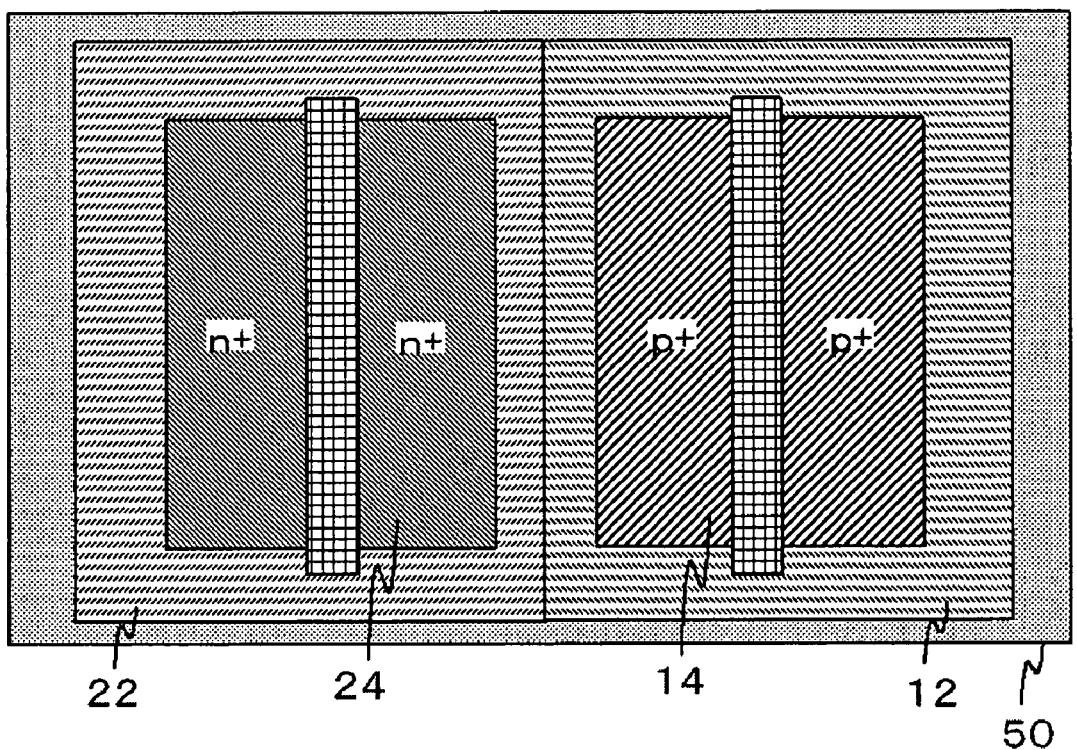
FIGS. 2A and 2B include diagrams showing structures of two substrates in the semiconductor integrated circuit device according to the first example of the present invention.
Figure 2B:
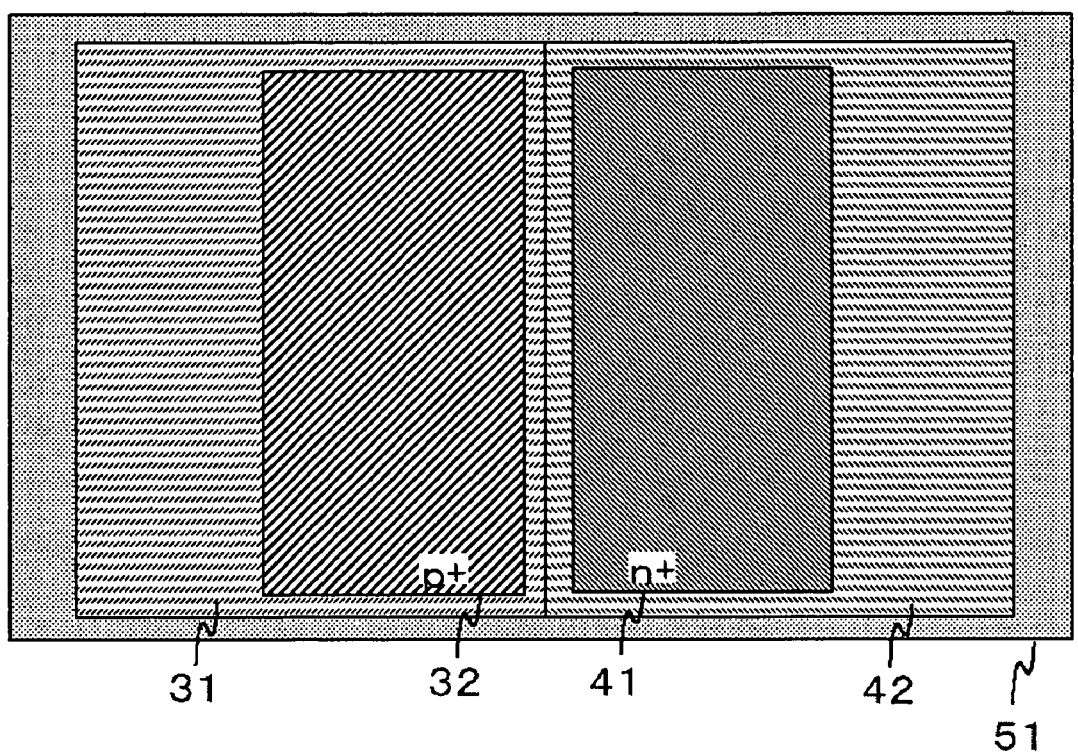

As shown in FIGS. 1A and 1B, this semiconductor integrated circuit device has a three-dimensional structure in which a substrate 50 (in FIG. 2A) with an inverter of the CMOS type constituted from the N-channel transistor N1 and the P-channel transistor P1 formed thereon is superimposed above a substrate 51 (in FIG. 2B) with the two diodes D1 and D2 formed thereon, in a vertical direction. The diode D1 and the diode D2 are arranged below the drain of the N-channel transistor N1 and the drain of the P-channel transistor P1, respectively. Alternatively, the diode D1 and the diode D2 may be arranged above the drain of the N-channel transistor N1 and the drain of the P-channel transistor P1, respectively.

The substrate 50 and the substrate 51 may be mechanically arranged one above the other. In this case, preferably, an interval between the substrate 50 and the substrate 51 is set to be as short as possible. An insulating film (insulating layer) 52 may be interposed between the substrate 50 and the substrate 51. A through electrode (via) or inter-substrate wiring 53 may be provided in this insulating film 52. In this case, film-like substrates may be used as the substrate 50 and the substrate 51.

As a method of arranging the two substrates to be separated from each other and connecting the two substrates, a method of utilizing a three-dimensional LSI that uses a silicon through electrode is described in a journal of "NIKKEI ELECTRONICS 2005. Oct. 10, pp 82-99" (The entire disclosure thereof being incorporated herein by reference thereto.). The structure described above can be formed by such a method, for example.

In the semiconductor integrated circuit device having such a structure, a radiation which has entered the region of the n+ diffusion layer 24 of the N-channel transistor N1 simultaneously enters the region of the p+ diffusion layer 32 of the diode D1 as well. A radiation which has entered the region of the p+ diffusion layer 14 of the P-channel transistor P1 simultaneously enters the region of the n+ diffusion layer 41 of the diode D2 as well. That is, the radiation simultaneously enters the drain diffusion region of the transistor and the diffusion layer region of the diode, and a current flows through each of the drain diffusion region of the transistor and the diffusion layer region of the diode. By flow of the current through both of the transistor and the diode as described above when the radiation enters the transistor, the current scarcely flows through a transistor in an on state. As a result, an output voltage of the inverter circuit hardly changes.

Figure 3A:
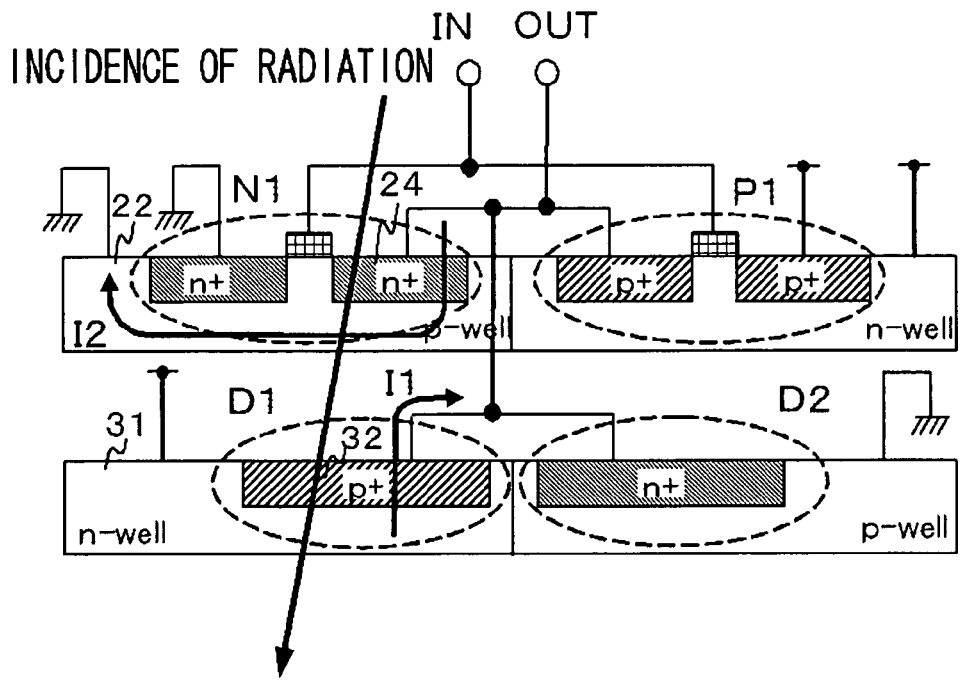
FIGS. 3A and 3B show diagrams showing current paths when a radiation enters a drain of an N-channel transistor N1.
Figure 3B:
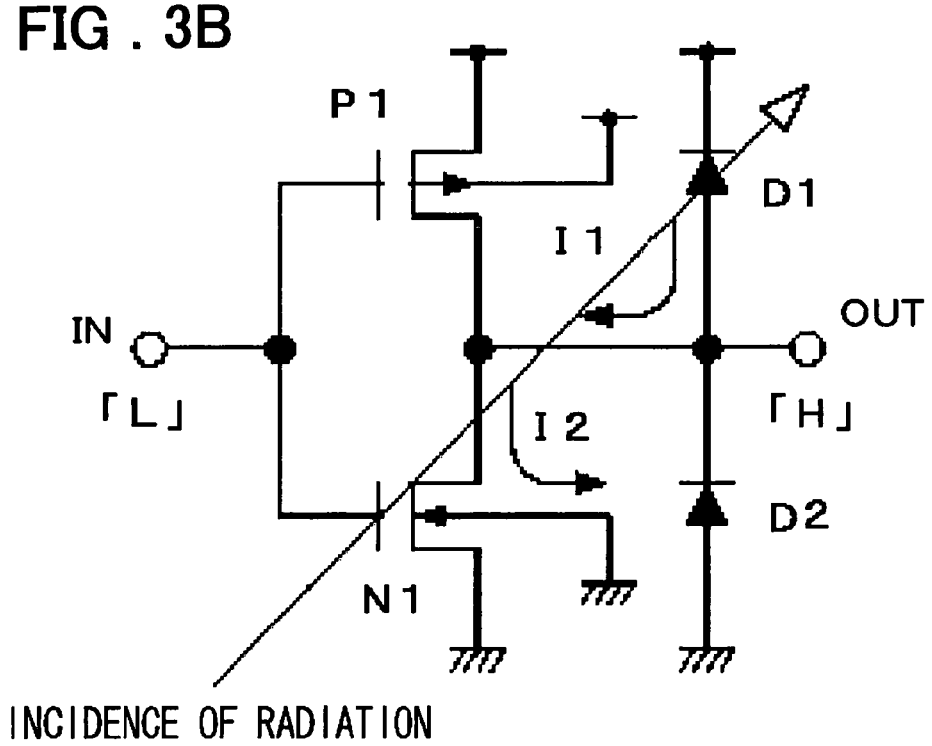

Next, an operation of the inverter circuit when a radiation enters a drain region of the transistor will be described. FIGS. 3A and 3B include diagrams showing current paths when the radiation enters the drain of the N channel transistor N1. Referring to FIGS. 3A and 3B, it is assumed that a low level "L" is input to the input terminal IN. As shown in FIGS. 3A and 3B, the radiation enters the n+ diffusion layer 24 (drain) of the transistor N1 in an off state. A current I2 thereby flows from the n+ diffusion layer 24 of the transistor N1 to the p well 22 (substrate). Further, the radiation that has entered the n+ diffusion layer 24 of the transistor N1 simultaneously enters the p+ diffusion layer 32 of the diode D1 as well. By incidence of the radiation on the p+ diffusion layer 32, a current I1 flows from the n well 31 (a cathode side) of the diode D1 to the p+ diffusion layer 32 (an anode side).

The currents I1 and I2 are generated by incidence of the same radiation. The currents I1 and I2 have the same magnitude and flow simultaneously. Accordingly, unlike in a conventional inverter circuit having no diodes D1 and D2, the current I2 is not supplied through the transistor P1 in the on state. That is, even if the current I2 flows, the voltage of the output terminal OUT will not change.

Figure 4A:
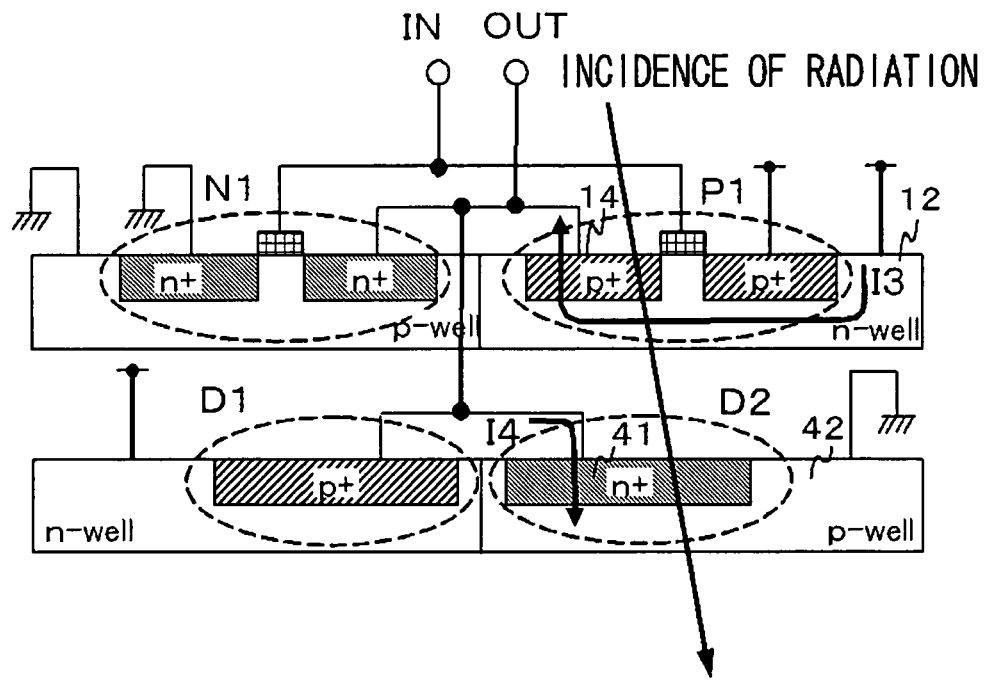
FIGS. 4A and 4B show diagrams showing current paths when a radiation enters a drain of a P-channel transistor P1.
Figure 4B:
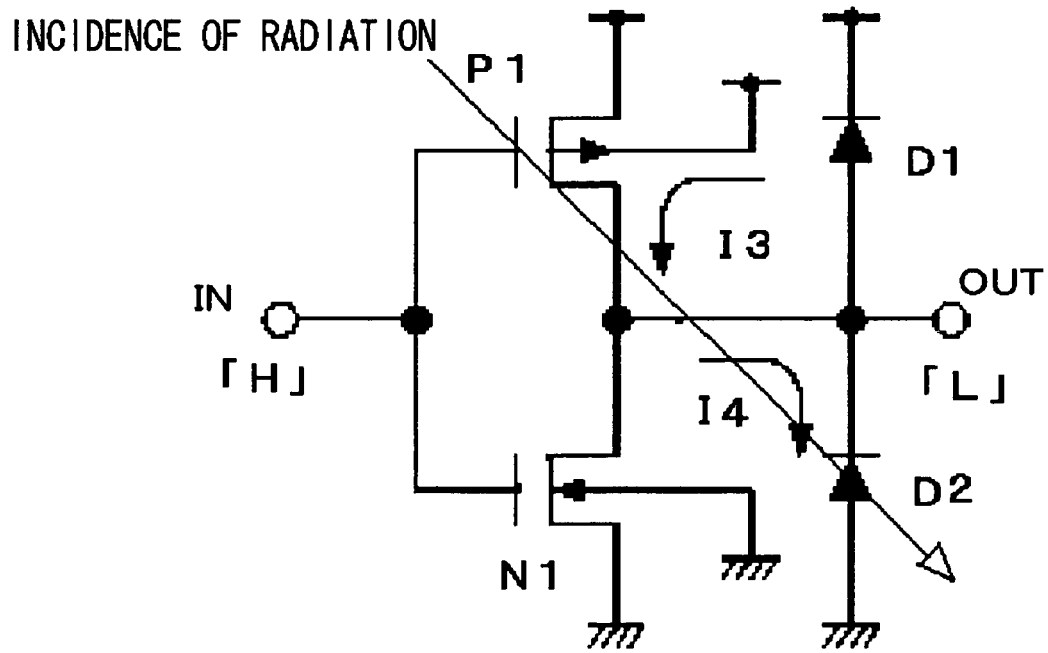

FIGS. 4A and 4B include diagrams showing current paths when a radiation has entered the drain of the P-channel transistor P1. Referring to FIGS. 4A and 4B, it is assumed that a high level "H" is input to the input terminal IN. As shown in FIGS. 4A and 4B, the radiation enters the p+ diffusion layer 14 (drain) of the transistor P1 in the off state. A current I3 thereby flows from the n well 12 (substrate) of the transistor P1 to the p+ diffusion layer 14. Further, the radiation that has entered the p+ diffusion layer 14 of the transistor P1 simultaneously enters the n+ diffusion layer 41 of the diode D2 as well. By incidence of the radiation on the n+ diffusion layer 41 of the diode D2, a current I4 flows from the n+ diffusion layer 41 (a cathode side) of the diode D2 to the p well 42 (an anode side).

The currents I3 and I4 are generated by incidence of the same radiation. The currents I3 and I4 have the same magnitude and flow simultaneously. Thus, the current I4 is supplied from the current I3. Accordingly, unlike in the conventional inverter circuit having no diodes D1 and D2, the current I3 is not supplied through the transistor N1 in the on state. That is, even if the current I3 flows, the voltage of the output terminal OUT will not change.

As described above, even if a radiation enters the transistor in the off state, the current generated in this transistor and the current generated in the diode cancel to each other. An influence on the output voltage of the inverter circuit can be thereby reduced.

Figure 5:
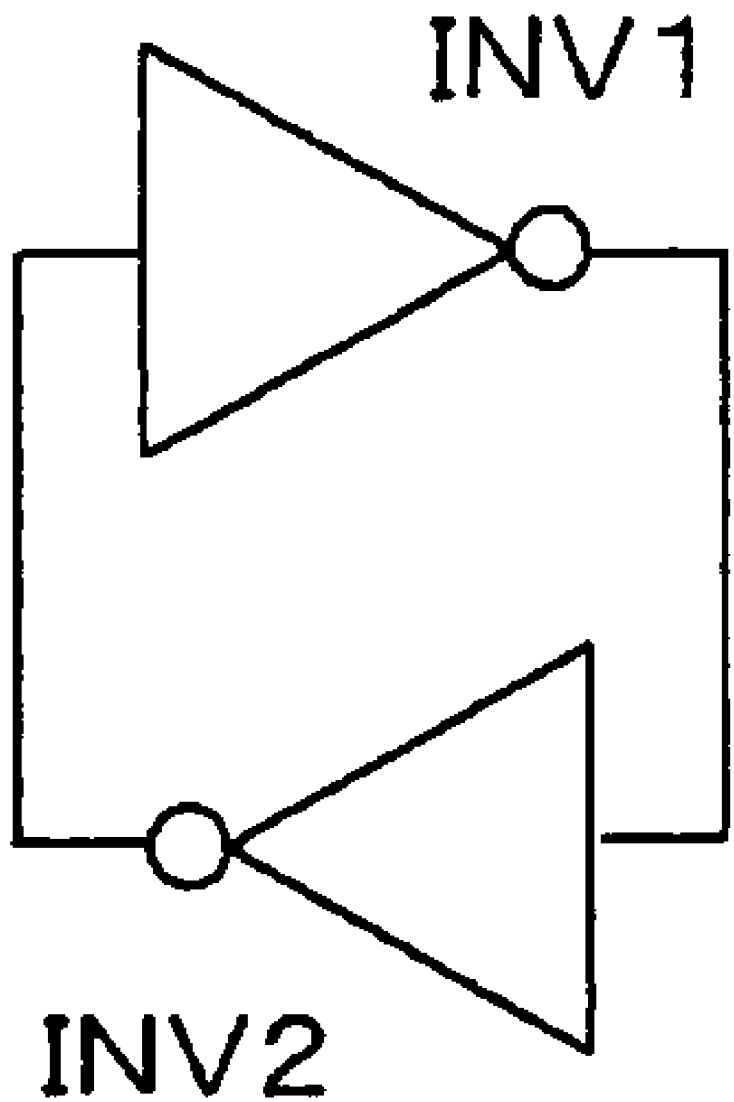
FIG. 5 is a diagram showing a configuration of a latch circuit.

The inverter circuits described above may be combined in a loop form as shown in FIG. 5, thereby forming a latch circuit. Even if a radiation enters each of the inverter circuits INV1 and INV2 that form this latch circuit, an output voltage of each of the inverter circuits INV1 and INV2 will hardly change. Accordingly, even if the radiation enters the latch circuit, a stored value in the latch circuit will not be inverted. In the latch circuit formed as described above, tolerance to radiation is strengthened more than in a conventional latch circuit. The latch circuit that does not deteriorate an operation speed can be thereby formed.

SECOND EXAMPLE

Figure 6:
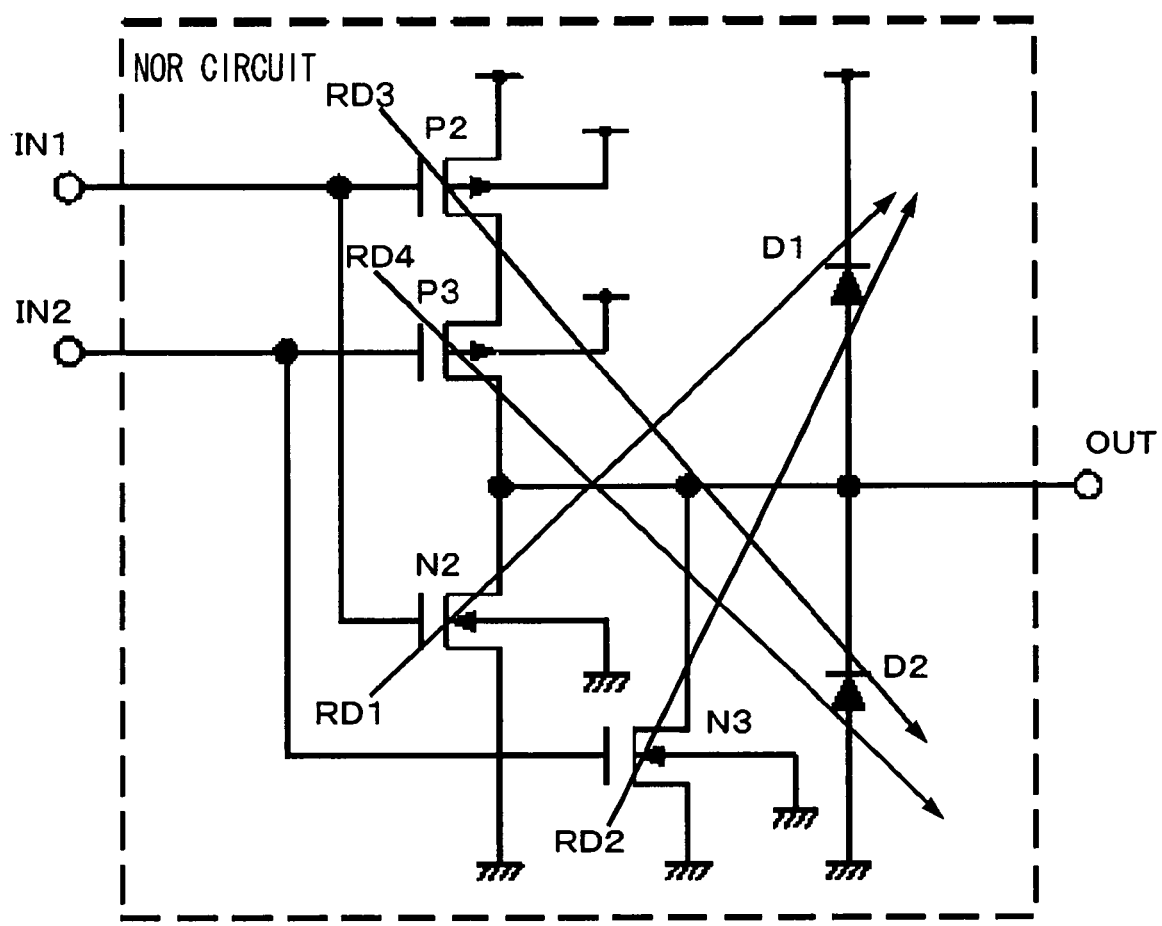
FIG. 6 is a circuit diagram of a semiconductor integrated circuit device according to a second example of the present invention.

FIG. 6 is a circuit diagram of a semiconductor integrated circuit device according to a second example of the present invention. A logic circuit shown in FIG. 6 is a two-input NOR circuit of the CMOS type, and includes a P-channel transistor P2 and a P-channel transistor P3, an N-channel transistor N2 and an N-channel transistor N3, and the diodes D1 and D2. A source and a back gate of the P-channel transistor P2 is connected to the power supply, a gate of the P-channel transistor P2 is connected to an input terminal IN1, and a drain of the P-channel transistor P2 is connected to a source of the P-channel transistor P3. A back gate of the P-channel transistor P3 is connected to the power supply. A gate of the P-channel transistor P3 is connected to an input terminal IN2. A drain of the P-channel transistor P3 is connected to the output terminal OUT. A source and a back gate of each of the N-channel transistor N2 and the N-channel transistor N3 are grounded. A gate of the N-channel transistor N2 is connected to the input terminal IN1, and a gate of the N-channel transistor N3 is connected to the input terminal IN2. A drain of each of the N-channel transistor N2 and the N-channel transistor N3 is commonly connected to the output terminal OUT. The cathode of the diode D1 is connected to the power supply, and the anode of the diode D1 is connected to the output terminal OUT. The cathode of the diode D2 is connected to the output terminal OUT, and the anode of the diode D2 is grounded.

In the NOR circuit described above, arrangement is made so that, when seen from a direction perpendicular to a substrate on which the NOR circuit is formed, a projection plane of the diffusion layer region of the diode D1 includes (covers) projection planes of drain regions of the N-channel transistors N2 and N3, and a substrate (or a p well) with the drain regions of the N-channel transistors N2 and N3 being present therein and a substrate (or an n well) with the diffusion layer region of the diode D1 being present therein are disposed separated from one another, as in the first example. Further, arrangement is made so that, as seen from the direction perpendicular to the substrate on which the NOR circuit is formed, a projection plane of the diffusion layer region of the diode D2 includes projection planes of drain regions of the P-channel transistors P2 and P3, and a substrate (or an n well) with the drain regions of the P-channel transistors P2 and P3 being present therein and a substrate (or a p well) with the diffusion layer region of the diode D2 being present therein are separated.

In the NOR circuit having a structure as described above, a radiation RD1 that has entered a drain region of the N-channel transistor N2 enters the diffusion layer region of the diode D1. A radiation RD2 that has entered a drain region of the N-channel transistor N3 also enters the diffusion layer region of the diode D1. On the other hand, a radiation RD3 that has entered a drain region of the P-channel transistor P2 enters the diffusion layer region of the diode D2. A radiation RD4 that has entered a drain region of the P-channel transistor P3 also enters the diffusion layer region of the diode D2. That is, the radiation enters the drain diffusion layer region of the transistor and the diffusion layer region of the diode at the same time, and a current flows through each of the drain diffusion region of the transistor and the diffusion layer region of the diode. By causing the current to flow through each of the transistor and the diode at a time of incidence of the radiation on the transistor as described above, the current does not flow through the transistor in the on state even at the time of incidence of the radiation, as in the first example. Accordingly, any change in an output voltage of the logic circuit due to an on resistance of the transistor does not occur. That is, even if the radiation enters this NOR circuit, the output voltage will not change.

Figure 8A:
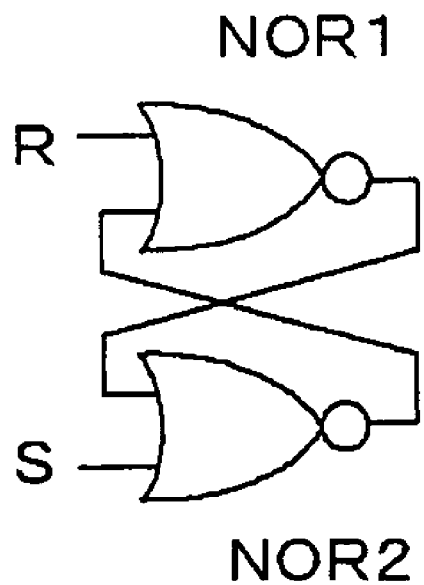
FIGS. 8A and 8B include circuit diagrams each showing an RS flip-flop.

By combining two NOR circuits NOR1 and NOR2 having strengthened tolerance to radiation as described above in a loop form as shown in FIG. 8A to form a latch circuit, the latch circuit with a set input (an RS flip-flop circuit) with the strengthened tolerance to radiation can be formed.

THIRD EXAMPLE

Figure 7:
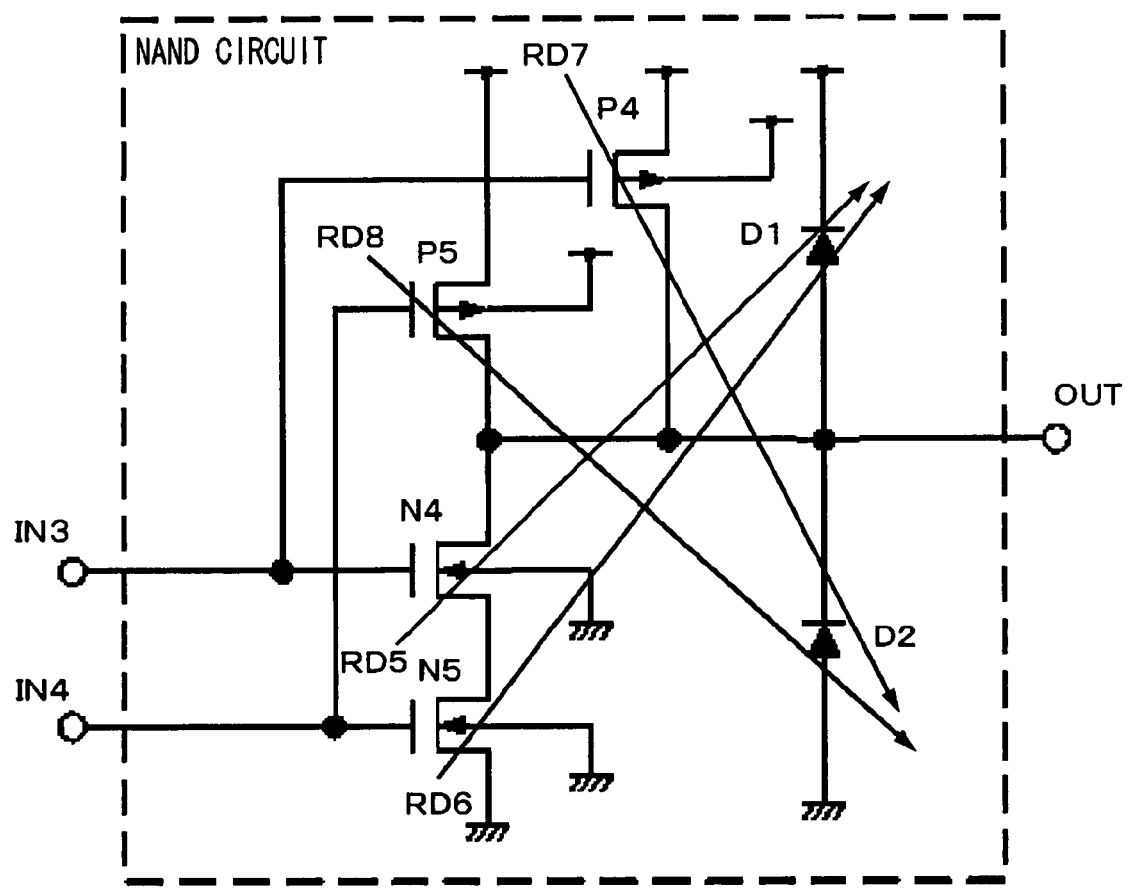
FIG. 7 is a circuit diagram showing a semiconductor integrated circuit device according to a third example of the present invention.

FIG. 7 is a circuit diagram of a semiconductor integrated circuit device according to a third example of the present invention. A logic circuit shown in FIG. 7 is a two-input NAND circuit of the CMOS type, and includes a P-channel transistor P4 and a P-channel transistor P5, an N-channel transistor N4 and an N-channel transistor N5, and the diodes D1 and D2. A source and a back gate of each of the P-channel transistor P4 and the P-channel transistor P5 are connected to the power supply. A gate of the P-channel transistor P4 is connected to an input terminal IN3, and a gate of the P-channel transistor P5 is connected to an input terminal IN4. A drain of each of the P-channel transistor P4 and the P-channel transistor P5 is connected to the output terminal OUT. A source of the N-channel transistor N4 is connected to a drain of the N-channel transistor N5. A gate of the N-channel transistor N4 is connected to the input terminal IN3. A back gate of the N-channel transistor N4 is grounded. A drain of the N-channel transistor N4 is connected to the output terminal OUT. A source and a back gate of the N-channel transistor N5 are grounded. A gate of the N-channel transistor N5 is connected to the input terminal IN4. A drain of the N-channel transistor N5 is connected to a source of the N-channel transistor N4. The cathode of the diode D1 is connected to the power supply. The anode of the diode D1 is connected to the output terminal OUT. The cathode of the diode D2 is connected to the output terminal OUT. The anode of the diode D2 is grounded.

In the NAND circuit described above, arrangement is made so that, when seen from a direction perpendicular to a substrate on which the NAND circuit is formed, a projection plane of the diffusion layer region of the diode D1 includes (covers) projection planes of drain regions of the N-channel transistors N4 and N5, and a substrate (or a p well) with the drain regions of the N-channel transistors N4 and N5 being present therein and a substrate (an n well) with the diffusion layer region of the diode D1 being present therein are disposed separated from one another, as in the first example. Further, arrangement is made so that, as seen from the direction perpendicular to the substrate on which the NAND circuit is formed, a projection plane of the diffusion layer region of the diode D2 includes projection planes of drain regions of the P-channel transistors P4 and P5, and a substrate (or an n well) with the drain regions of the P-channel transistors P4 and P5 being present therein and a substrate (or a p well) with the diffusion layer of the diode D2 being present therein are disposed separated from one another.

In the NAND circuit having a structure as described above, a radiation RD5 that has entered a drain region of the N-channel transistor N4 enters the diffusion layer region of the diode D1 as well. A radiation RD6 that has entered a drain region of the N-channel transistor N5 also enters the diffusion layer region of the diode D1. On the other hand, a radiation RD7 that has entered a drain region of the P-channel transistor P4 enters the diffusion layer region of the diode D2 as well. A radiation RD8 that has entered a drain region of the P-channel transistor P5 also enters the diffusion layer region of the diode D2. That is, the radiation enters the drain diffusion layer region of the transistor and the diffusion layer region of the diode at the same time, and a current flows through each of the drain diffusion region of the transistor and the diffusion layer region of the diode. By causing the current to flow through each of the transistor and the diode at a time of incidence of the radiation on the transistor as described above, the current does not flow through the transistor in the on state even at the time of incidence of the radiation, as in the first example. Accordingly, a change in an output voltage of the logic circuit due to an on resistance of the transistor does not occur. That is, even if the radiation enters this NAND circuit, the output voltage will not change.

Figure 8B:
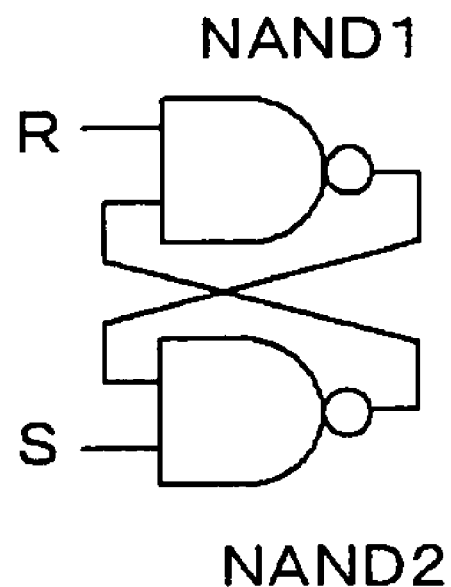
Figure 9:
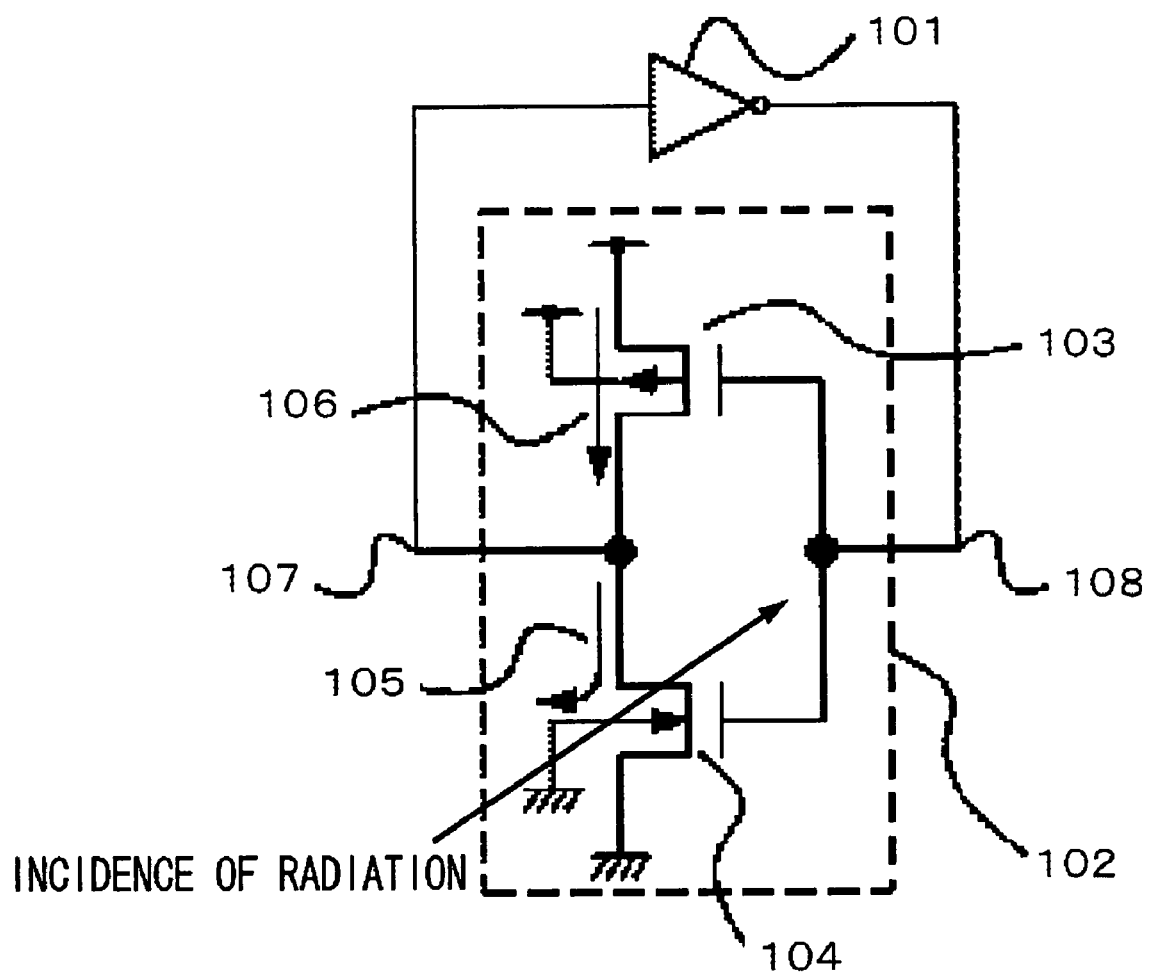
FIG. 9 is a diagram explaining an erroneous operation of a conventional latch circuit.

By combining two NAND circuits NAND1 and NAND2 with strengthened tolerance to radiation as described above in a loop form as shown in FIG. 8B to form a latch circuit, the latch circuit with a set input (RS flip-flop circuit) with the strengthened tolerance to radiation can be formed.

Incidentally, by combining two sets of the latch circuits with the set input or a reset input (RS flip-flop circuits) as described in the second and third examples, a flip-flop circuit with the strengthened tolerance to radiation can be formed.

The present invention has been described in connection with the examples described above. The present invention is not limited to the examples described above, and of course includes various variations and modifications that could be made by those skilled in the art within the scope of respective claims of the present application.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device comprising:
    a logic circuit of a CMOS type formed by combining a field-effect transistor group of a first conductivity type with a field-effect transistor group of a second conductivity type,
    said field-effect transistor group of the first conductivity type being connected between a power supply and an output terminal, said field-effect transistor group of the second conductivity type being connected between ground and said output terminal;
    said logic circuit comprising:
    a first diode connected between said power supply and said output terminal to provide an inverse bias; and
    a second diode connected between said ground and said output terminal to provide an inverse bias;

wherein, when seen from a direction perpendicular to a first substrate having the logic circuit formed thereon, a projection plane of a diffusion layer region of the first diode includes projection planes of respective drain diffusion layer regions of transistors included in said field-effect transistor group of the second conductivity type; and the first substrate having respective drain diffusion layer regions of said transistors included in said field-effect transistor group of the second conductivity type being present therein is disposed separated from a second substrate having said diffusion layer region of the first diode being present therein; and wherein, when seen from the direction perpendicular to the substrate having said logic circuit formed thereon, a projection plane of a diffusion layer region of the second diode includes projection planes of respective drain diffusion layer regions of transistors included in said field-effect transistor group of the first conductivity type; and the first substrate having respective drain diffusion layer regions of said transistors included in said field-effect transistor group of the first conductivity type being present therein is disposed separated from the second substrate having said diffusion layer region of the second diode being present therein.

2. The semiconductor integrated circuit device according to claim 1, wherein said logic circuit comprises an inverter circuit having said field-effect transistor group of the first conductivity type comprising first transistors, and having said field-effect transistor group of the second conductivity type comprising second transistors.

3. The semiconductor integrated circuit device according to claim 2, comprising:
two of said inverter circuits;
said two of said inverter circuits forming a latch circuit by combining an input terminal of one of said inverter circuits to an output terminal of the other of said inverter circuits and combining an input terminal of the other of said inverter circuits to an output terminal of the one of said inverter circuits.

4. The semiconductor integrated circuit device according to claim 1, wherein
said logic circuit comprises a two-input NOR circuit in which said field-effect transistor group of the first conductivity type comprises first and second transistors connected in cascade, and said field-effect transistor group of the second conductivity type comprises third and fourth transistors connected in parallel.

5. The semiconductor integrated circuit device according to claim 1, wherein
said logic circuit comprises a two-input NAND circuit in which said field-effect transistor group of the first conductivity type comprises first and second transistors connected in parallel, and said field-effect transistor group of the second conductivity type comprising third and fourth transistors connected in cascade.

6. The semiconductor integrated circuit device according to claim 4, comprising:
two of said two-input NOR circuits;
said two of said two-input NOR circuits forming a flip-flop circuit by combining an input terminal of one of said two-input NOR circuits to an output terminal of the other of said two-input NOR circuits and combining an input terminal of the other of said two-input NOR circuits to an output terminal of the one of said two-input NOR circuits.

7. The semiconductor integrated circuit device according to claim 5, comprising:
two of said two-input NAND circuits;
said two of said two-input NAND circuits forming a flip-flop circuit by connecting an input terminal of one of said two-input NAND circuits to an output terminal of the other of said two-input NAND circuits and connecting an input terminal of the other of said two-input NAND circuits to an output terminal of the one of said two-input NAND circuits.

8. The semiconductor integrated circuit device according to claim 1, wherein the substrate having the respective drain diffusion layer regions being present therein and the substrate having said diffusion layer region of the first diode being present therein are superposed together interposed with an insulating layer.

9. The semiconductor integrated circuit device according to claim 8, wherein said insulating layer includes therein:
a wiring pattern that makes electrical connection between the first substrate with the respective drain diffusion layer regions being present therein and the second substrate having said diffusion layer region of the first diode being present therein.

10. A semiconductor integrated circuit device comprising:
a logic circuit of a CMOS type formed by combining a first conductivity type field-effect transistor with a second conductivity type field-effect transistor,
said first conductivity type field-effect transistor being connected between a power supply and an output terminal, the second conductivity type field-effect transistor being connected between ground and said output terminal;
said logic circuit comprising:
a first diode connected between said power supply and said output terminal to provide an inverse bias; and
a second diode connected between said ground and said output terminal to provide an inverse bias;
wherein, when seen from a direction perpendicular to a first substrate having said logic circuit formed thereon, a projection plane of a diffusion layer region of the first diode includes a projection plane of a drain diffusion layer region of the second conductivity type field-effect transistor; and the first substrate having said drain diffusion layer region being present therein is disposed separated from a second substrate having said diffusion layer region of the first diode being present therein; and
wherein, when seen from the direction perpendicular to the first substrate having said logic circuit formed thereon, a projection plane of a diffusion layer region of the second diode includes a projection plane of a drain diffusion layer region of the first conductivity type field-effect transistor; and the first substrate having said drain diffusion layer region being present therein is disposed separated from the second substrate having said diffusion layer region of the second diode being present therein.

* * * * *